(12) United States Patent
Thompson

(10) Patent No.: US 9,643,844 B2
(45) Date of Patent: May 9, 2017

(54) LOW TEMPERATURE ATOMIC LAYER DEPOSITION OF FILMS COMPRISING SICN OR SICON

(71) Applicant: Applied Materials, Inc., Santa Clara, CA (US)

(72) Inventor: David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/771,697

(22) PCT Filed: Feb. 28, 2014

(86) PCT No.: PCT/US2014/019481
§ 371 (c)(1),
(2) Date: Aug. 31, 2015

(87) PCT Pub. No.: WO2014/134476
PCT Pub. Date: Sep. 4, 2014

(65) Prior Publication Data
US 2016/0002039 A1    Jan. 7, 2016

Related U.S. Application Data

(60) Provisional application No. 61/896,956, filed on Oct. 29, 2013, provisional application No. 61/771,445, filed on Mar. 1, 2013.

(51) Int. Cl.
| | | |
|---|---|---|
| *C23C 16/36* | (2006.01) | |
| *C23C 16/48* | (2006.01) | |
| *C23C 16/455* | (2006.01) | |
| *C01B 21/082* | (2006.01) | |
| *C23C 16/30* | (2006.01) | |

(52) U.S. Cl.
CPC ........ *C01B 21/0828* (2013.01); *C23C 16/308* (2013.01); *C23C 16/36* (2013.01); *C23C 16/45525* (2013.01); *C23C 16/45553* (2013.01); *C23C 16/48* (2013.01)

(58) Field of Classification Search
CPC ......... C23C 14/14; C23C 14/16; C23C 14/18; C23C 14/20
USPC ........................................................ 427/559
See application file for complete search history.

(56) References Cited

U.S. PATENT DOCUMENTS

| | | |
|---|---|---|
| 5,186,718 A | 2/1993 | Tepman et al. |
| 6,818,250 B2 | 11/2004 | George et al. |
| 7,897,208 B2 | 3/2011 | Mahajani et al. |
| 2006/0014399 A1 | 1/2006 | Joe |
| 2006/0228903 A1* | 10/2006 | McSwiney ............ C23C 16/308 438/778 |
| 2007/0296027 A1* | 12/2007 | Yang ................. H01L 21/82380 257/327 |
| 2008/0268264 A1 | 10/2008 | Akiyama et al. |
| 2009/0137132 A1 | 5/2009 | Bhatia et al. |
| 2010/0081293 A1 | 4/2010 | Mallick et al. |
| 2012/0058282 A1 | 3/2012 | Hong et al. |

FOREIGN PATENT DOCUMENTS

WO    WO-2009/149167    12/2009

OTHER PUBLICATIONS

PCT International Search Report and Written Opinion in PCT/US2014/019481, mailed Jun. 19, 2014, 15 pages.
Du, Y. et al., Mechanism of Pyridine-Catalyzed SiO2 Atomic Layer Deposition Studied by Fourier Transform Infrared Spectroscopy, *J. Phys. Chem. C* vol. 111 2007, 219-226.
Du, Y. et al., SiO2 film growth at low temperatures by catalyzed atomic layer deposition in a viscous flow reactor, *Thin Solid Films* vol. 491 2005, 43-53.
Kim, Hyeong, Characterization of low-dielectric-constant SiOC thin films deposited by PECVD for interlayer dielectrics of multi-level interconnection, *Surface and Coatings Technology* vol. 171 2003, 39-45.
PCT International Preliminary Report on Patentability in PCT/US2014/019481, dated Sep. 11, 2015, 10 pages.

* cited by examiner

*Primary Examiner* — Dah-Wei D Yuan
*Assistant Examiner* — Jose Hernandez-Diaz
(74) *Attorney, Agent, or Firm* — Servilla Whitney LLC

(57) ABSTRACT

Provided are methods for the deposition of films comprising SiCN and SiCON. Certain methods involve exposing a substrate surface to a first and second precursor, the first precursor having a formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5, and the second precursor comprising a reducing amine. Certain methods also comprise exposure of the substrate surface to an oxygen source to provide a film comprising SiCON.

9 Claims, 5 Drawing Sheets

LOW TEMPERATURE ATOMIC LAYER DEPOSITION OF FILMS COMPRISING SICN OR SICON

CROSS-REFERENCE TO RELATED APPLICATIONS

This is the National Phase entry of International Patent Application No. PCT/US14/19481, filed Feb. 28, 2014, which claims priority to U.S. Provisional Application No. 61/771,445, filed Mar. 1, 2013, and U.S. Provisional Application No. 61/896,956, filed Oct. 29, 2013, the disclosures of which are incorporated herein by reference in their entireties.

TECHNICAL FIELD

The present invention relates generally to methods of depositing thin films. In particular, the invention relates to atomic layer deposition processes for the deposition of SiCN or SiCON films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited.

ALD has been used to deposit metals and metal compounds on substrate surfaces. $Al_2O_3$ deposition is an example of a typical ALD process illustrating the sequential and self-limiting reactions characteristic of ALD. $Al_2O_3$ ALD conventionally uses trimethylaluminum (TMA, often referred to as reaction "A" or the "A" precursor) and $H_2O$ (often referred to as the "B" reaction or the "B" precursor). In step A of the binary reaction, hydroxyl surface species react with vapor phase TMA to produce surface-bound $AlOAl(CH_3)_2$ and $CH_4$ in the gas phase. This reaction is self-limited by the number of reactive sites on the surface. In step B of the binary reaction, $AlCH_3$ of the surface-bound compound reacts with vapor phase $H_2O$ to produce AlOH bound to the surface and $CH_4$ in the gas phase. This reaction is self-limited by the finite number of available reactive sites on surface-bound $AlOAl(CH_3)_2$. Subsequent cycles of A and B, purging gas phase reaction products and unreacted vapor phase precursors between reactions and between reaction cycles, produces $Al_2O_3$ growth in an essentially linear fashion to obtain the desired film thickness. Because of the usefulness of ALD processes, there is an ongoing need for new ALD chemistries.

Silicon nitride is a commonly used dielectric throughout the semiconductor industry. However, there is an increasing need for dielectrics with lower dielectric constant (k) values and with lower etch rates. Thus, there is a need for ALD chemistries of improved dielectrics.

SUMMARY

One aspect of the invention relates to a method of depositing a film. In one or more embodiments, the method comprises exposing a substrate surface to a first and second precursor, the first precursor having a formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5, and the second precursor comprising a reducing amine. In some embodiments, each X is independently selected from Cl, Br and I. In one or more embodiments, the first precursor has a formula $(X_yH_{3-y}Si)_zCH_{4-z}$. In some embodiments, the first precursor has a structure represented by:

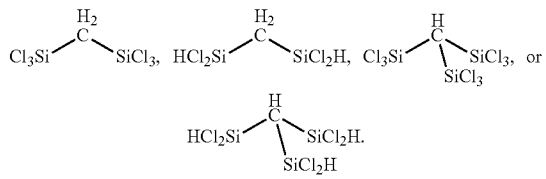

In one or more embodiments, the first precursor comprises bis(trichlorosilyl)methane. In some embodiments, the first precursor has a formula $(X_yH_{3-y}Si)(CH_2)_n(SiX_yH_{3-y})$. In further embodiments, n has a value of 2 or 3. In one or more embodiments, the second precursor comprises ammonia or hydrazine. In some embodiments, a film comprising SiCN is provided. In one or more embodiments, the method further comprises exposing the film comprising SiCN to an ultraviolet treatment. In some embodiments, the method further comprises exposing the substrate surface to a third precursor comprising hexachlorodisilane.

In some embodiments, a film comprising SiCON may be deposited. The method described above may be followed, and further comprises exposing the substrate surface to an oxygen precursor. In some embodiments, the substrate surface is exposed to the oxygen precursor at the same time as the reducing amine. In one or more embodiments, the oxygen precursor comprises $O_3$, $H_2O_2$, oxygen plasma, $O_2$ or $H_2O$.

Another aspect of the invention also pertains to a method of depositing a film. The method comprising exposing a substrate surface to a first precursor, the first precursor having a formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5; exposing a substrate surface to a second precursor, the second precursor comprising a reducing amine to deposit a film comprising SiCN; and exposing the film comprising SiCN to an ultraviolet treatment. In one or more embodiments, exposure of the substrate to the first and second precursor is repeated prior to exposing the film comprising SiCN to an ultraviolet treatment. In some embodiments, the first precursor has a formula $(X_yH_{3-y}Si)_zCH_{4-z}$. In one or more embodiments, the first precursor has a structure represented by:

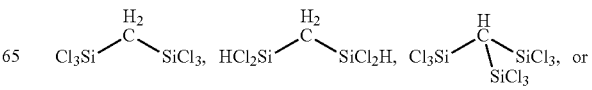

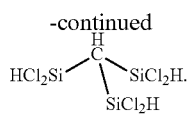

In one or more embodiments, the first precursor comprises bis(trichlorosilyl)methane. In some embodiments, the first precursor has a formula $(X_yH_{3-y}Si)(CH_2)_n(SiX_yH_{3-y})$, and n has a value of 2 or 3. In one or more embodiments, the second precursor comprises ammonia or hydrazine.

As with the first aspect, in some embodiments, a film comprising SiCON may be deposited. The method described above may be followed, and further comprises exposing the substrate surface to an oxygen precursor. In some embodiments, the substrate surface is exposed to the oxygen precursor at the same time as the reducing amine. In one or more embodiments, the oxygen precursor comprises $O_3$, $H_2O_2$, oxygen plasma, $O_2$ or $H_2O$.

A third aspect of the invention pertains to a method of depositing a film, the method comprising exposing a substrate surface to a first and second precursor, the first precursor comprising bis(trichlorosilyl)methane, and the second precursor comprising $NH_3$ to deposit a film comprising SiCN. In one or more embodiments, the method further comprises exposing the film comprising SiCN to an ultraviolet treatment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
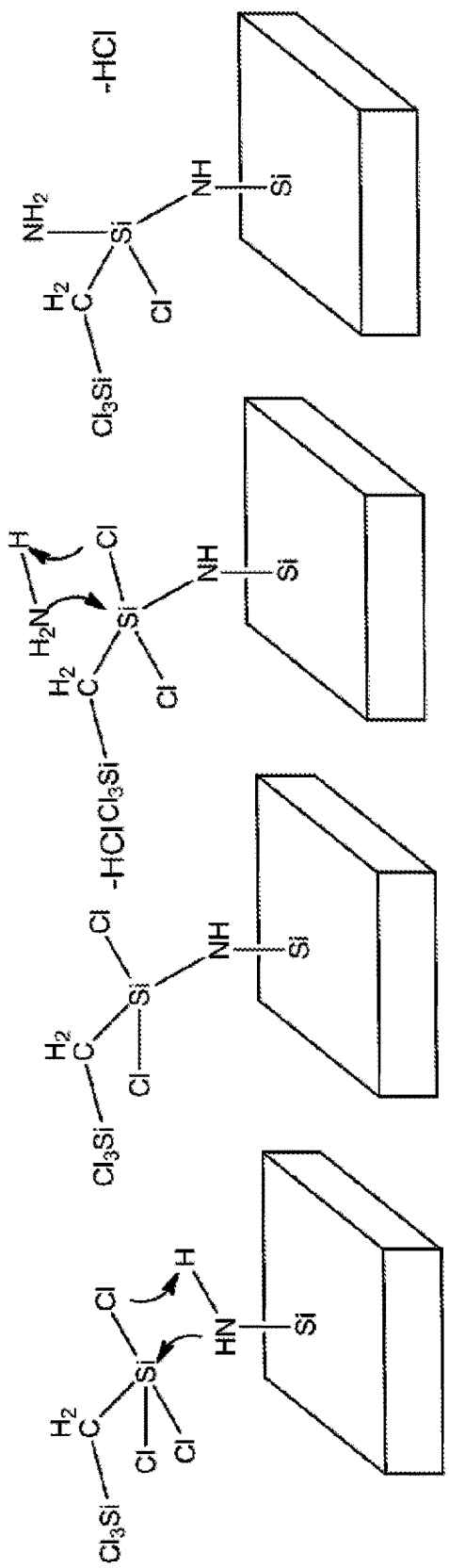
FIG. 1 shows a schematic of a method in accordance with one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

It has been discovered that SiCN films can be deposited using certain silicon precursors which contain a halogen and a second precursor selected from ammonia. As the silicon precursor contains carbon, the resulting film also contains carbon. Such SiCN films can exhibit better dielectric constants than the conventional SiN films. Specifically, the carbon content can lower the dielectric constant, which lowers leakage at a transistor level.

Accordingly, one aspect of the invention relates to method of depositing a film. The method comprises exposing a substrate surface to a first and second precursor, the first precursor having a formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5, and the second precursor comprising a reducing amine. In one or more embodiments, a film comprising SiCN is provided.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

In some embodiments, the substrate surface that will be exposed to various precursors contains a layer that allows the reaction of either the first or second precursors. Examples include layers that contain reactive —OH or —NH moieties or handles.

The first precursor is a silicon precursor, and acts as both a silicon and carbon source. Notably, the silicon precursor contains at least one halogen bounded to each of the at least two silicon atoms. This allows the precursor to bond to the substrate, while still providing a reactive moieties or handle for subsequent reactions.

In some embodiments, the first precursor has a formula $(X_yH_{3-y}Si)_zCH_{4-z}$. In one or more embodiments, each X is independently selected from Cl, Br and I. In further embodiments, embodiments at least one of the X groups is Cl. In even further embodiments, all X groups are Cl. Such a compound is known as bis(trichlorosilyl)methane (BTCSM), hexachlorodisilylmethylene (HCDSM), 1,1'-methylenebis(1,1,1-trichlorosilane), or methylenebis(trichlorosilane), and has a structure represented by:

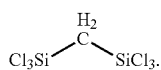

Other examples of suitable precursors include, but are not limited to those having a structure represented by:

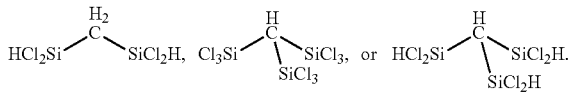

In other embodiments, the first precursor has a formula $(X_yH_{3-y}Si)(CH_2)_n(SiX_yH_{3-y})$. In further embodiments, n has a value of 2 or 3, or in even further embodiments, 2. Compounds of this formula may be used to further increase the carbon content, as the starting C:Si ratio will be higher. In one or more embodiments, each X is independently selected from Cl, Br and I. In further embodiments, embodiments at least one of the X groups is Cl. In even further embodiments, all X groups are Cl.

In yet other embodiments, the first precursor comprises $(X_yH_{3-y}Si)(CH_2)(SiX_pH_{2-p})(CH_2)(SiX_yH_{3-y})$, wherein X is a halogen, y has a value of between 1 and 3, p has a value of between 0 and 2. In one or more embodiments, each X is independently selected from Cl, Br and I. In further embodiments, embodiments at least one of the X groups is Cl. In even further embodiments, all X groups are Cl. Examples of such precursors include, but are not limited to, $(ClSiH_2)(CH_2)(SiH_2)(CH_2)(SiH_2Cl)$ and $(Cl_2SiH)(CH_2)(SiClH)(CH_2)(SiHCl_2)$.

The silicon/carbon precursors described herein can better deposit SiCN films than other means of carbon incorporation, as the precursors already contain Si—C bonds. As such, Si—C bonding in the film can be ensured.

Although there can be some Si—H bonds in the first precursor, it may be advantageous in some embodiments to have more halogen-silicon bonding. Such situations include those where there is a desire to increase the stress of the film. That is, the stress in a film can be tuned by tuning the amount of Si—H bonding there is in the film. The fewer Si—H bonds in the starting precursor, the fewer Si—H bonds in the resulting film, thereby having an increased stress.

The precursors can be selected to tune the amount of carbon in the deposited film. The higher the carbon: silicon ratio of the precursors, the higher the ratio will be in the resulting SiOC film. For example, in embodiments where the first precursor has formula $(X_yH_{3-y}Si)(CH_2)_n(SiX_yH_{3-y})$, longer carbon chains can be selected to result in a higher carbon content in the deposited film. If the desired amount of carbon is less than that when a precursor with just one carbon atom is utilized, then a higher ratio of silicon can be deposited by using a silane-based precursor. Such precursors include hexachlorodisilane ($Cl_3Si$—$SiCl_3$). Thus, in some embodiments, the method further comprises exposing the substrate surface to a third precursor, which may comprise hexachlorodisilane. This allows for silicon to be deposited at a higher rate than would otherwise be afforded with just the carbon-containing precursor. An exemplary sequence could comprise flowing: $(X_yH_{3-y}Si)_zCH_{4-z}$, $NH_3$, $Cl_3Si$—$SiCl_3$, and $NH_3$.

In one or more embodiments, the carbon content of the film is less than about 30, 25 or 20%. In some embodiments, the carbon content of the film ranges from between about 5% to about 15%.

In some embodiments, the second precursor comprises a reducing amine. In some embodiments, the second precursor comprises ammonia or hydrazine.

Once a film comprising SiCN is deposited, the film may be further exposed to an ultraviolet treatment. While not wishing to be bound to any particular theory, the ultraviolet treatment is thought to break Si—H and N—H bonds in the film, thereby allowing for Si—N bonds to form. As discussed above, a reduction in the Si—H bonding allows for an increase in strength capability.

In some embodiments, a film comprising SiCON may be deposited. The method described above may be followed, and further comprises exposing the substrate surface to an oxygen precursor. Examples of suitable oxygen precursors include, but are not limited to, oxygen gas ($O_2$) and water vapor ($H_2O$).

In some embodiments, the substrate surface is exposed to the oxygen precursor at the same time as the reducing amine. This may be referred to as "co-flowing" the reducing amine and oxygen precursor. The term "co-flow" includes where there is merely some overlap, rather than exactly co-extensive flows.

In one or more embodiments, the substrate surface is exposed to the oxygen precursor separately from the reducing amine (i.e. as a third precursor). In such embodiments, exposure of the substrate surface to the first precursor (i.e. the carbon/silicon source) and the second precursor (i.e. the reducing amine) occurs prior to exposure to an oxygen source (e.g., oxygen gas or water vapor). Exposure of the substrate surface to the first and second precursor may occur several times prior to exposure to the oxygen source. That is, a film comprising SiCN may be built up over several cycles of deposition prior to deposition of oxygen.

Thus, an exemplary recipe for the deposition of a film comprising SiCON using BTCSM and ammonia is: X[Y [BTCSM pulse/Inert Purge/$_{NH3}$ pulse/Inert purge]/[$O_2$ or $H_2O$ pulse/inert purge]], where X represents the total number of cycles for the entire process, Y represents the number of loops for the BTCSM+$NH_3$ process.

Purges may be used after first, second and/or third precursors are flowed into the deposition chamber. That is, the substrate and chamber may be exposed to a purge step after stopping the flow of a given precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

The ultraviolet treatment can be carried out either during film deposition, or once deposition has been completed. That is, in one or more embodiments, the process may comprise exposure of the substrate surface to the first precursor, then second precursor, followed by the ultraviolet treatment, and then the whole process is repeated. In other embodiments, the exposure to the first and second precursors may be repeated until a desired film thickness is achieved, then followed by the ultraviolet treatment. In other embodiments, varying combinations of the above are used. Thus for example, exposure to the first and second precursor may be repeated, then exposure to the ultraviolet treatment, then exposure to the first and second precursor, etc.

FIG. 1 shows an exemplary embodiment of the invention. As seen in the figure, a substrate surface contains a —$NH_2$ group. A first precursor, in this case, bis(trichlorosilyl)methane, is flowed, and the substrate surface is exposed to it. The substrate surface and the first precursor react, thereby bonding bis(trichlorosilyl)methane to the surface with HCl as a byproduct. Ammonia is then flowed and displaces each of the remaining chlorine atoms, again with HCl byproduct. The resulting film therefore comprises SiCN. Notably, the exposure to ammonia leaves exposed —$NH_2$ groups for the next cycle of the reaction, showing the importance of having at least two halogens in the first precursor so that there will always be another —$NH_2$ group for the next cycle. In one or more embodiments, the method further comprises exposing the film comprising SiCN to an ultraviolet treatment (not shown) to help densify the film by breaking residual and undesired Si—H and N—H bonds.

The precursors may be flowed and/or exposed to the substrate surface either sequentially or substantially simultaneously. In embodiments where the substrate is exposed to the precursors sequentially, the process may be repeated up until a desired film thickness has been achieved. As used herein, "substantially simultaneously" refers to either co-flow or where there is merely overlap between exposures of the precursors. In one or more embodiments, the catalyst is added with any one or more of the reactants.

The reaction conditions for the ALD reaction will be selected based on the properties of the film precursors, substrate surface, and the catalyst. The deposition may be carried out at atmospheric pressure, but may also be carried out at reduced pressure. The vapor pressure of the catalyst should be low enough to be practical in such applications. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and catalyst used and pressure. The properties of the specific substrate, film precursors, and catalyst may be evaluated using methods known in the art, allowing selection of appropriate temperature and pressure for the reaction.

In one or more embodiments, the deposition is carried out at a temperature less than about 400, 350, 300, 250, 200, 150, 125, or 100° C. In some embodiments, the deposition is carried out at a temperature in the range of about 70 to about 100° C., about 70 to about 125° C. or about 70 to about 125° C.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the various precursors either spatially or temporally separated processes. Temporal ALD is a traditional process in which the first precursor flows into the chamber to react with the surface.

The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa. The term "expose to a substrate surface" and the use of the term "flow" is intended to encompass both processes.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

SiCN Film Composition

A film comprising SiCN was deposited using bis(trichlorosilyl)methane and $NH_3$ precursors during an atomic layer deposition process. Film deposition took place at a substrate temperature of 450° C. with a chamber pressure of 8 Torr. The ampoule temperature was room temperature. The carrier gas flow was 100 sccm and was of the bubbler variety. The bis(trichlorosilyl)methane pulse had a duration of 5 seconds.

The elemental content of the film was evaluated. The quantifications in the averaged bulk film are shown in Table 1 below:

TABLE 1

| O1s | C1s | N1s | Si2p-O | Si2p |
|---|---|---|---|---|
| 15.87 | 13.77 | 27.68 | 41.12 | 1.56 |

Figure 2:
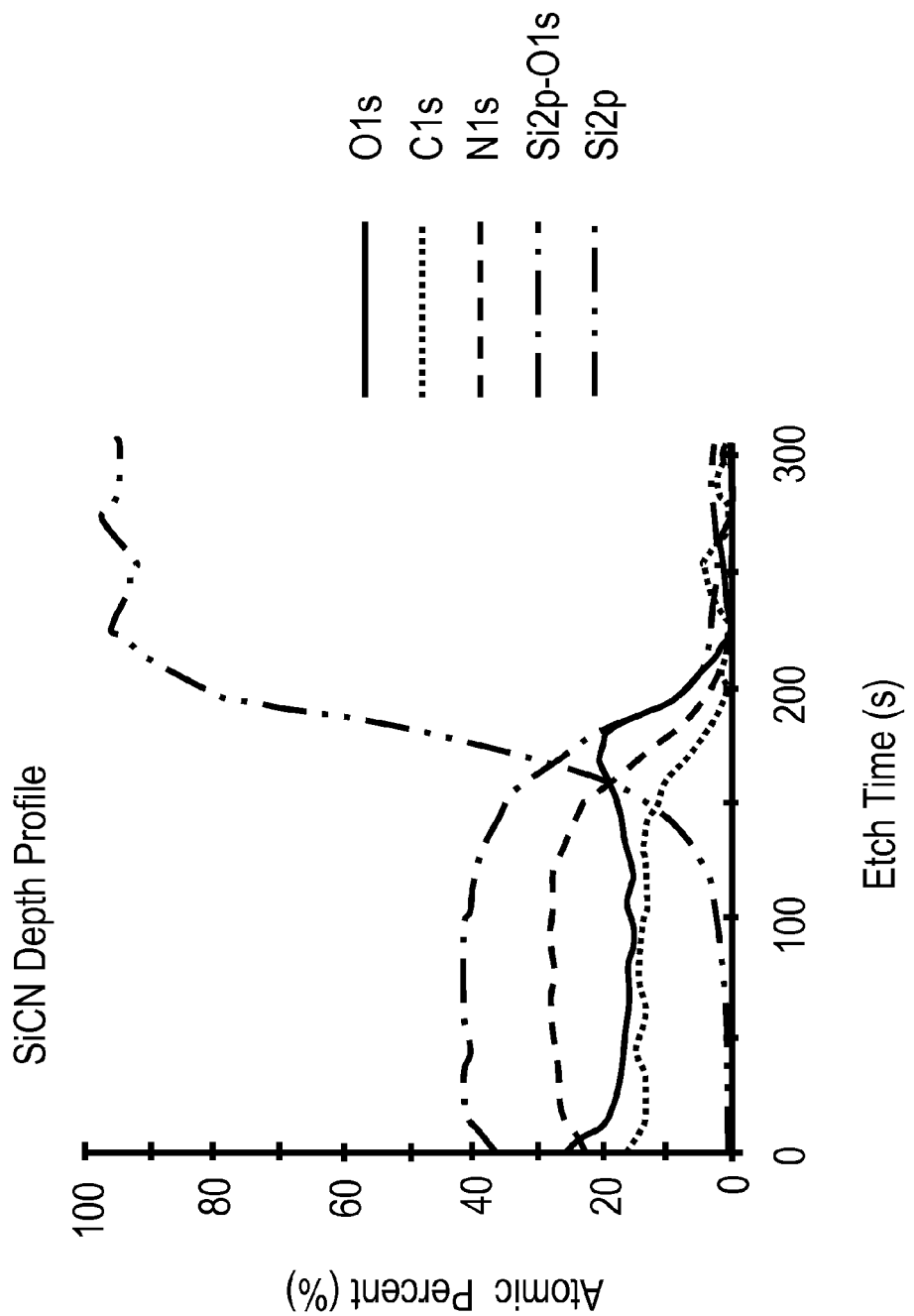
FIG. 2 shows a depth profile of the elemental content of a film deposited according to one or more embodiments of the invention.

The depth profile was also measured using X-ray photoelectron spectroscopy, a graph of which is shown as FIG. 2. As seen from Table 1 and FIG. 2, an SiCN film was formed. Oxygen that is present in the film is thought to have arisen from a post-deposition air exposure.

Example 2

Blanket Deposition

Figure 3:
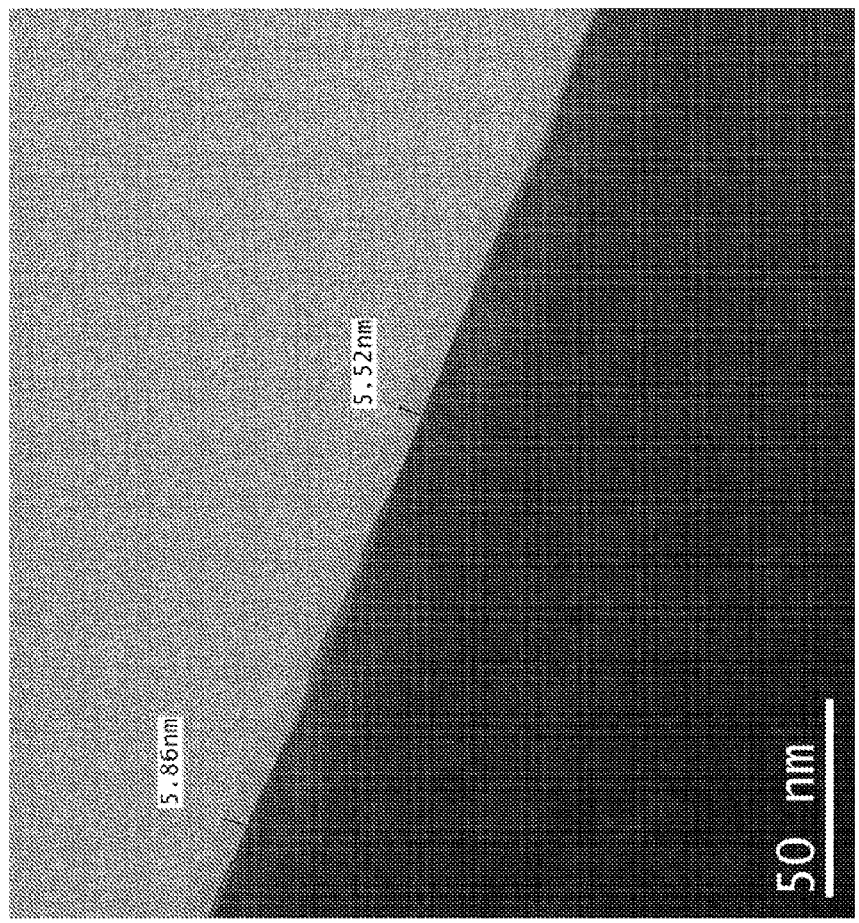
FIG. 3 shows a transmission electron microscope image of a film deposited according to one or more embodiments of the invention deposited over a flat substrate.

A SiCN film was deposited according to the conditions set forth in Example 1, and an ammonia pulse of 12 seconds. The film was deposited over a flat substrate. A transmission electron microscopy image was taken of the film, and is shown in FIG. 3. As shown in the figure, the film is highly conformal.

Example 3

Step Coverage

Figure 4:
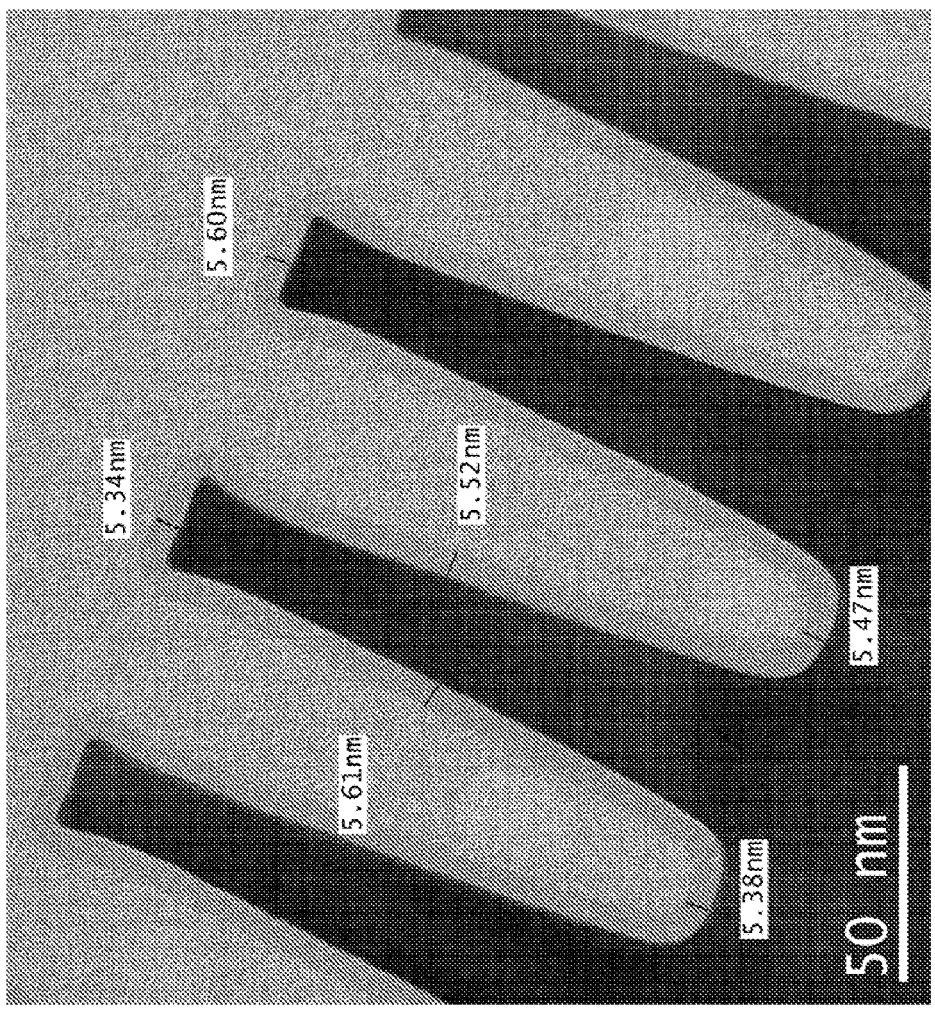
FIG. 4 shows a transmission electron microscope image of a film deposited according to one or more embodiments of the invention over a substrate with features.

A SiCN film was deposited according to the conditions set forth in Example 1, and an ammonia pulse of 12 seconds. The film was deposited over a substrate with features. A transmission electron microscopy image was taken of the film, and is shown in FIG. 4. As shown in the figure, the film is highly conformal. This demonstrates that the method is suitable for film deposition over a wide variety of substrates, including those with features having high aspect ratios.

Example 4

SiCON Film

A film comprising SiCON was deposited using bis(trichlorosilyl)methane, $NH_3$, and $H_2O$ precursors during an atomic layer deposition process. The precursor pulsing sequence went as follows: 1) BTCSM (2 s) 2) Inert purge (10 s) 3) $NH_3$ (12 s) 4) Inert purge (10 s); this sequence was repeated 9 times and then the following pulse sequence would ensue: 5) $H_2O$ (0.3 s) 6) Inert purge (10 s); after step 6, the pulse sequence would start over at step 1. The total loop was repeated 50 times. Film deposition took place at a substrate temperature of 500° C. with a chamber pressure of 8 Torr. The ampoule temperature was kept at room temperature. The carrier gas flow was 100 sccm and was of the bubbler variety.

The elemental content of the film was evaluated. The quantifications in the averaged bulk film are shown in Table 2 below:

TABLE 2

| C1s | Cl2p | N1s | O1s | Si2p |
|---|---|---|---|---|
| 8.4 | 0.0 | 17.3 | 30.8 | 43.5 |

Figure 5:
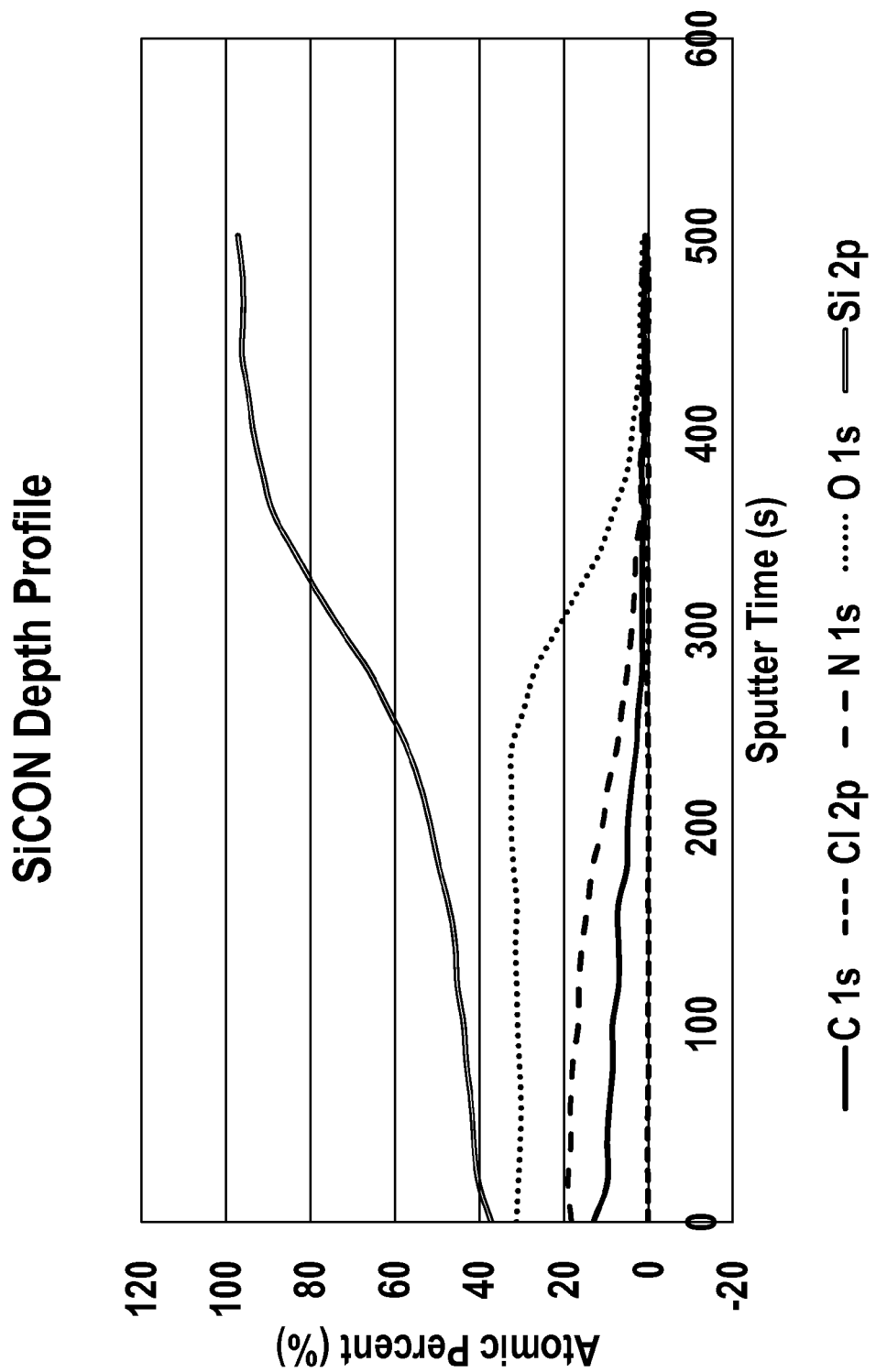
FIG. 5 shows a depth profile of the elemental content of a film deposited according to one or more embodiments of the invention.

The depth profile was also measured using X-ray photoelectron spectroscopy, a graph of which is shown as FIG. 5. As seen from Table 2 and FIG. 5, a SiCON film was formed. The majority of the oxygen that is present in the film is due to periodic treatments with water during the pulsing sequence.

What claimed is:

1. A method of depositing a film, the method comprising exposing a substrate surface to a first and second precursor, the first precursor having a formula $(X_yH_{3-y}Si)(CH_2)(SiX_pH_{2-p})(CH_2)(SiX_yH_{3-y})$ wherein X is a halogen, y has a value of between 1 and 3, and p has a value of between 0 and 2, and the second precursor comprising a reducing amine.

2. The method of claim 1, wherein each X is independently selected from Cl, Br and I.

3. The method of claim 1, wherein the second precursor comprises ammonia or hydrazine.

4. The method of claim 1, wherein a film comprising SiCN is provided.

5. The method of claim 1, further comprising exposing the film comprising SiCN to an ultraviolet treatment.

6. The method of claim 1, further comprising exposing the substrate surface to a third precursor comprising hexachlorodisilane.

7. A method of depositing a film, the method comprising:
a. exposing a substrate surface to a first precursor, the first precursor having a formula, $(X_yH_{3-y}Si)(CH_2)(SiX_pH_{2-p})(CH_2)(SiX_yH_{3-y})$, wherein X is a halogen, y has a value of between 1 and 3, and p has a value of between 0 and 2;
b. exposing a substrate surface to a second precursor, the second precursor comprising a reducing amine to deposit a film comprising SiCN; and
c. exposing the film comprising SiCN to an ultraviolet treatment.

8. The method of claim 7, wherein exposure of the substrate to the first and second precursor is repeated prior to exposing the film comprising SiCN to an ultraviolet treatment.

9. The method of claim 7, wherein the second precursor comprises ammonia or hydrazine.

* * * * *

UNITED STATES PATENT AND TRADEMARK OFFICE
CERTIFICATE OF CORRECTION

PATENT NO.        : 9,643,844 B2
APPLICATION NO.   : 14/771697
DATED             : May 9, 2017
INVENTOR(S)       : David Thompson Page 1 of 1

It is certified that error appears in the above-identified patent and that said Letters Patent is hereby corrected as shown below:

On the Title Page

Item (56), Column 2, under "U.S. Patent Documents", Line 7, delete "21/82380" and insert -- 21/823807 --, therefor.

In the Specification

In Column 2, Line 20, delete "," before "or".

In Column 2, Line 65, delete "," before "or".

In Column 5, Line 11, delete "," before "or".

In the Claims

In Column 11, in Claim 1, Line 11, after "(SiX$_y$H$_{3-y}$)" insert -- , --.

In Column 12, in Claim 7, Line 6, after "formula" delete ",".

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*